US006767817B2

(12) United States Patent
Farnworth et al.

(10) Patent No.: US 6,767,817 B2
(45) Date of Patent: Jul. 27, 2004

(54) ASYMMETRIC PLATING

(75) Inventors: Warren M. Farnworth, Nampa, ID (US); Joseph T. Lindgren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/193,001

(22) Filed: Jul. 11, 2002

(65) Prior Publication Data

US 2004/0007611 A1 Jan. 15, 2004

(51) Int. Cl.[7] .............................................. C23C 18/32
(52) U.S. Cl. ...................... 438/612; 427/123; 427/438
(58) Field of Search ................................ 438/612, 613, 438/614; 427/123, 438; 428/936, 680, 599, 614, 209

(56) References Cited

U.S. PATENT DOCUMENTS

| 3,798,136 A | * | 3/1974 | Olsen et al. ................. 205/131 |
| 5,487,999 A | | 1/1996 | Farnworth ...................... 437/7 |
| 5,495,667 A | | 3/1996 | Farnworth et al. ............. 29/843 |
| 5,527,734 A | * | 6/1996 | van der Putten ............. 438/613 |
| 5,686,318 A | | 11/1997 | Farnworth et al. ............. 437/8 |
| 5,726,075 A | | 3/1998 | Farnworth et al. ............. 438/18 |
| 5,789,278 A | | 8/1998 | Akram et al. ................ 438/118 |
| 5,801,452 A | | 9/1998 | Farnworth et al. .......... 257/797 |
| 5,834,945 A | | 11/1998 | Akram et al. ................ 324/755 |
| 5,876,580 A | * | 3/1999 | Lykins, II .................... 205/104 |
| 5,915,977 A | | 6/1999 | Hembree et al. ............. 439/74 |
| 5,931,685 A | | 8/1999 | Hembree et al. ............. 439/74 |
| 5,936,845 A | * | 8/1999 | Soejima et al. .............. 361/767 |
| 5,995,378 A | | 11/1999 | Farnworth et al. ........... 361/796 |
| 6,000,603 A | * | 12/1999 | Koskenmaki et al. ....... 228/246 |
| 6,013,948 A | | 1/2000 | Akram et al. ................ 257/698 |
| 6,020,629 A | | 2/2000 | Farnworth et al. ........... 257/686 |
| 6,088,237 A | | 7/2000 | Farnworth et al. ........... 361/796 |
| 6,088,238 A | | 7/2000 | Farnworth et al. ........... 361/796 |
| 6,094,058 A | | 7/2000 | Hembree et al. ............ 324/755 |
| 6,107,119 A | | 8/2000 | Farnworth et al. ........... 438/106 |
| 6,133,638 A | | 10/2000 | Farnworth et al. ........... 257/778 |
| 6,235,554 B1 | | 5/2001 | Akram et al. ................ 438/109 |
| 6,250,933 B1 | * | 6/2001 | Khoury et al. ................. 439/66 |
| 6,255,840 B1 | | 7/2001 | Hembree et al. ............ 324/765 |
| 6,271,056 B1 | | 8/2001 | Farnworth et al. ........... 438/106 |
| 6,291,908 B1 | * | 9/2001 | Tran et al. .................... 307/112 |
| 6,305,230 B1 | * | 10/2001 | Kasukabe et al. ............. 73/855 |
| 6,333,555 B1 | | 12/2001 | Farnworth et al. ........... 257/737 |
| 6,387,714 B1 | | 5/2002 | Farnworth et al. ............ 438/15 |
| 6,392,429 B1 | | 5/2002 | Hembree et al. ............ 324/755 |
| 6,404,063 B2 | | 6/2002 | Farnworth et al. ........... 257/778 |
| 6,437,591 B1 | | 8/2002 | Farnworth et al. ........... 324/765 |
| 6,670,698 B1 | * | 12/2003 | Glenn et al. ................. 257/678 |
| 2003/0001932 A1 | * | 1/2003 | Bahl et al. ..................... 347/76 |

FOREIGN PATENT DOCUMENTS

JP        10-140325        *   5/1998

* cited by examiner

*Primary Examiner*—John J. Zimmerman
(74) *Attorney, Agent, or Firm*—Fletcher Yoder

(57) ABSTRACT

A method and apparatus are disclosed for forming a tapered contact structure over a contact pad. The tapered contact structure may be used to securely anchor an overlying solder bump or solder ball. Additionally, the tapered contact structure allows the use of either larger contact pads or, alternately, allows a greater density of contact pads to be achieved on an integrated circuit substrate.

25 Claims, 8 Drawing Sheets

ASYMMETRIC PLATING

BACKGROUND OF THE INVENTION

1. Field of the Invention

This present invention relates generally to the field of integrated circuit connectivity and, more specifically, to the field of plating contact structures upon bond pads.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing and control are issues typically considered by design engineers tasked with meeting customer requirements while implementing innovations which are constantly being developed for computer systems and their components. Computer systems typically include a variety of electrically interconnected integrated circuit (I/C) packages which perform a variety of functions, including memory and processing functions. Electrical interconnection of these I/C packages typically include numerous bond pads, which are structures that interface with the external connectors that join the assorted circuits. Typically, the external connectors that interface with the bond pads are either wires or solder balls depending on the mounting technique employed.

Whatever technique is employed, a conductive layer is typically disposed upon the recessed bond pads of the I/C package to provide an electrical contact surface for the solder or the wire. In the event solder balls or bumps are employed, the deposition of such a conductive layer is referred to as underbump metalization. Electroless deposition of nickel is typically used to form the conductive layer during the underbump metalization process and also for depositing a conductive layer in preparation for wire bonding.

Electroless nickel deposition is performed using a chemical bath containing nickel and stabilizers. The stabilizers control the manner in which nickel is deposited, often by enhancing the plating of large surfaces in preference to smaller surfaces. Controlling the amount and type of stabilizer therefore allows one to select which features are plated.

Due to the manner in which electroless nickel deposition is performed, the conductive layers formed on the bond pads tend to be shaped like mushrooms, spilling over the recessed bond pad and extending outwards. Since deposition typically occurs isotropically, the periphery of the conductive layer tends to continue expanding both upward and outward until deposition is halted. This "spillover" deposition necessitates that bond pads be spaced apart by a minimum safe distance to prevent inadvertent electrical contact between bond pads. The additional space necessitated by these spillover depositions adds unnecessary size to the I/C package or, alternatively, prevents the attainment of more dense configurations of bond pads upon the I/C package. These effects prevent the optimum scaling of the I/C package from being achieved.

Additionally, the mushroom cap shape associated with the conductive layer is not optimal either for wire bonding or for solder ball techniques. The mushroom cap shape, while producing an acceptable wire bond, consumes an unnecessarily large surface area. Additionally, even with increased inter-pad spacing, the overflow increases the likelihood of incidental electrical interconnection between adjacent bond pads. For wire bonding, it would be preferable for the surface area presented by the conductive layer to correspond to the area actually needed for a successful wire bond and no more.

In the case of the solder ball or solder bump based techniques, the balls or bumps are disposed upon the conductive cap layer. The rounded surface of the conductive layer is not optimal for maximizing the shear strength of such connections. Instead, the surface area between the conductive layer and the solder structure is relatively minimal, producing less interface area to withstand shearing events. It would be preferable to construct conductive layers that minimize or eliminate such spillovers and increase the interface area available for solder ball contacts.

The present invention may address one or more of the concerns set forth above.

BRIEF DESCRIPTION OF THE DRAWINGS

Certain advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
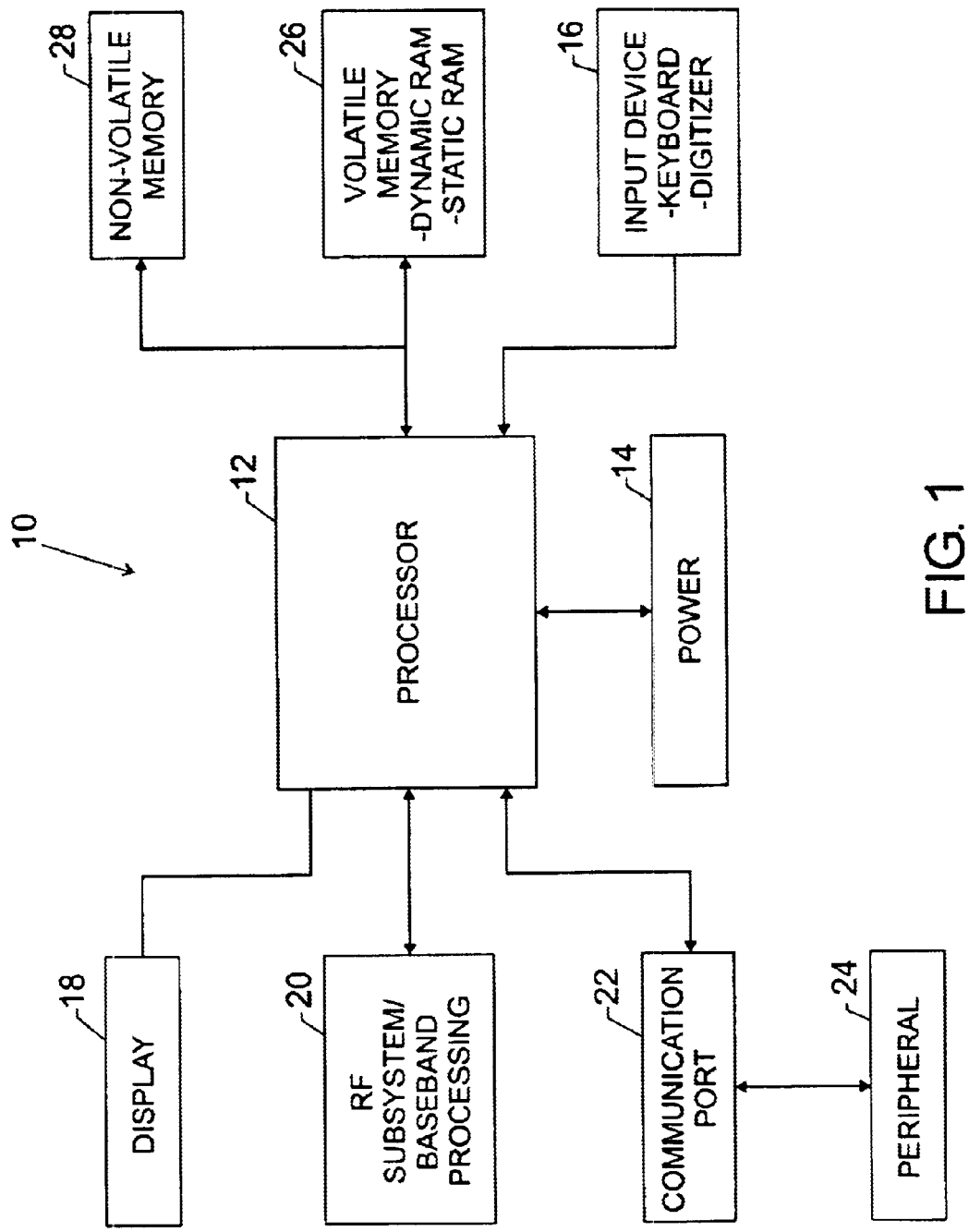
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, computer peripheral, network device, biomedical device, audio or visual device, communications apparatus, control circuit, etc. In a typical processor-based device, a processor 12, such as a microprocessor, controls the processing of system functions and requests in the system 10. Further, the processor 12 may comprise a plurality of processors which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM and/or flash memory, to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
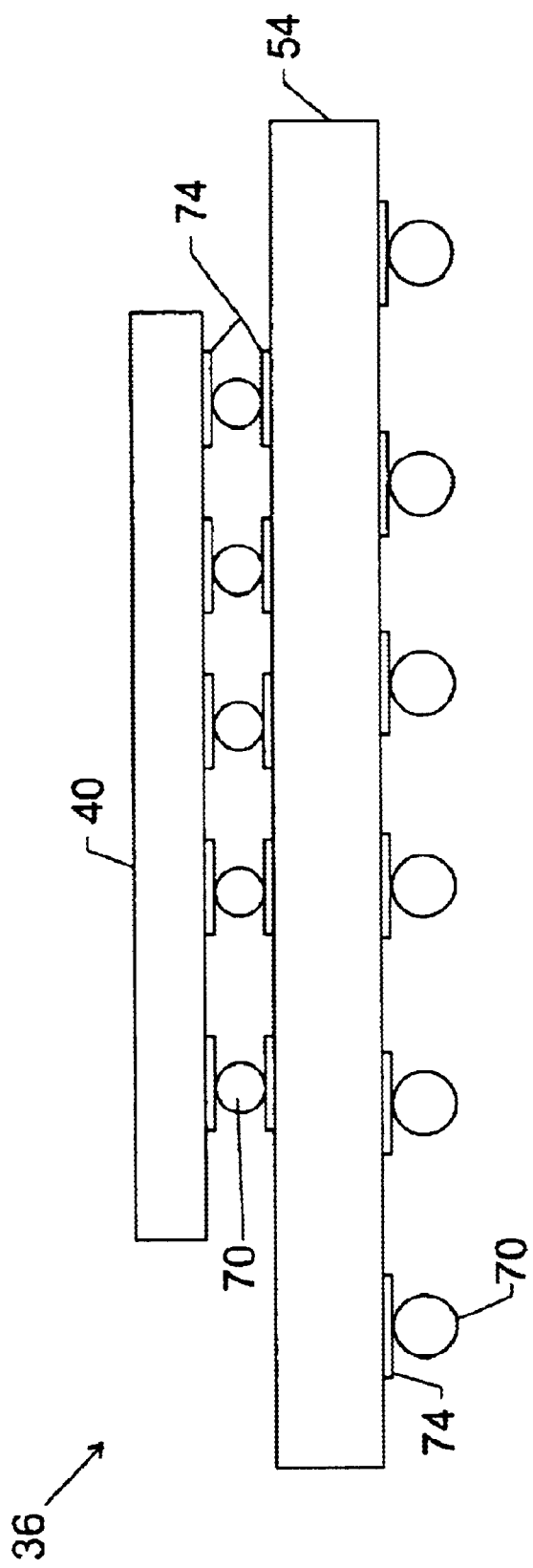
FIG. 2 illustrates a side view of a ball grid array package in accordance with the present invention.

FIG. 2 illustrates a partial cross-sectional view depicting an exemplary integrated circuit (I/C) package 36 such as may be used in the system 10. The I/C package 36 typically includes an I/C chip 40, such as a memory chip or microprocessor chip. Contact pads 74 may be formed on the facing surfaces of both a chip 40 and a substrate 54 as well as the opposing facing of the substrate 54. The contact pads 74 serve as contact points for solder balls or, alternately, the formation points for solder bumps. In the depicted embodiment, the I/C chip 40 is electrically coupled to a substrate 54 by solder balls 70. The solder balls 70 are also disposed on the bottom surface of the substrate 54 so that the I/C package 36 can be electrically coupled to a printed circuit board (PCB), for example. Both the substrate 54 and the chip 40 also include conductive routing and/or vias (not shown) which provide an electrical signal path between the contact pads 74 and the respective internal circuits.

Figure 3:
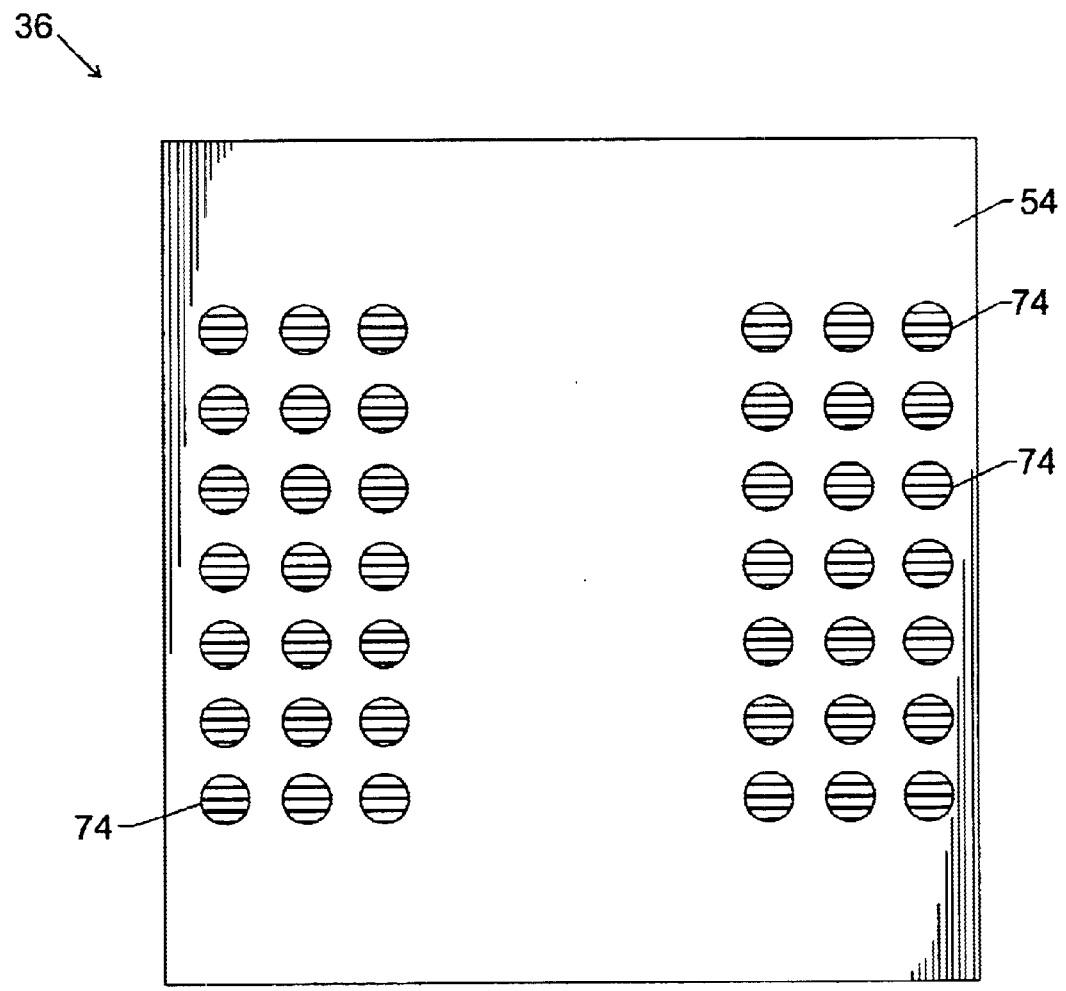
FIG. 3 illustrates a plan view of the backside of a ball grid array package in accordance with the present invention.

Referring now to FIG. 3, a plan view depicting an exemplary I/C package 36, as seen from below, is illustrated. The contact pads 74 are depicted as generally round but it is understood that they may be any shape, such as square or rectangular, and are not limited to circular configurations. While FIG. 3 demonstrates one possible configuration of the contact pads 74 on the bottom facing of the substrate 54, it is to be understood that the facing surfaces of a substrate 54 and a chip 40 may be similarly formed such that corresponding contact surfaces are provided for the connective solder balls or bumps.

Figure 4:
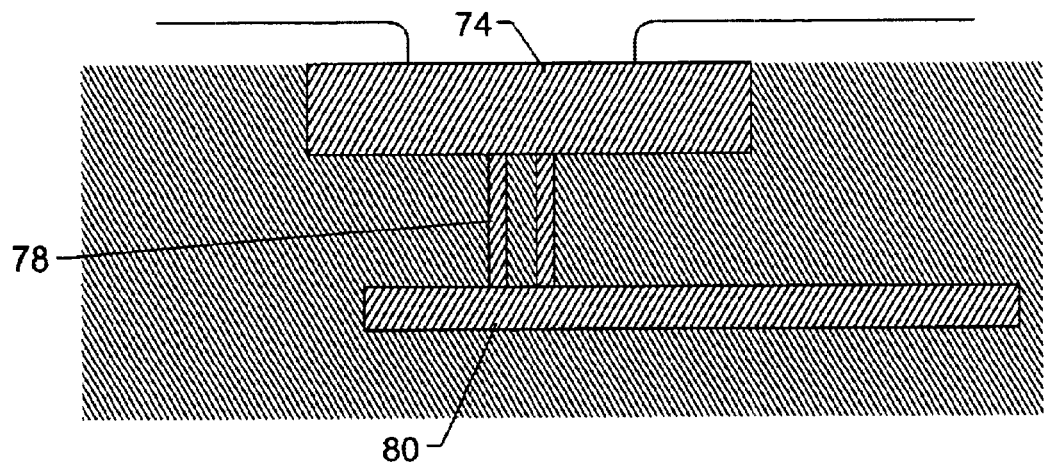
FIG. 4 illustrates a cross-sectional view of a bond pad disposed upon a substrate.

Referring now to FIG. 4, a partial cross-sectional view of a contact pad 74 is depicted. The contact pad 74 may be disposed upon either the substrate 54 or the chip 40. Typically, the contact pad 74 is recessed relative to the surface of the chip 40 or the substrate 54. The contact pad 74 is typically in electrical contact with an interconnect layer 80 or structure disposed within the substrate 54 or the chip 40 by means of vias 78 or other conductive means.

Figure 5:
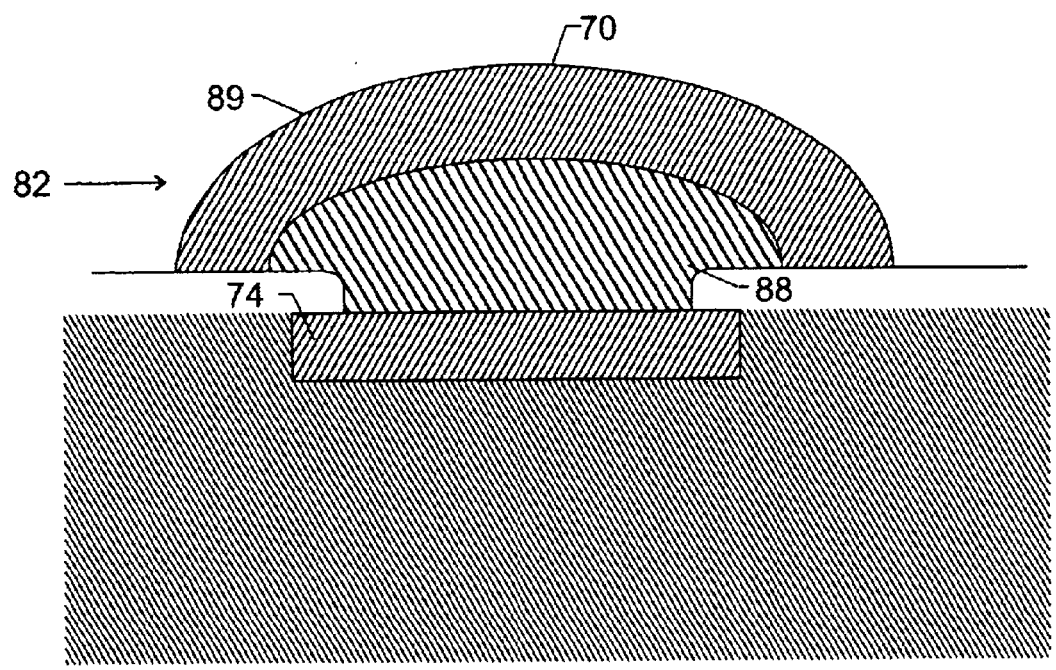
FIG. 5 illustrates a cross-sectional view of a conventional bond pad in electrical contact with a solder bump.

A conventional configuration, depicted in FIG. 5, includes a nickel cap 88 disposed upon a contact pad 74. The upper surface of the nickel cap 88 presents an underbump interface 89 upon which a solder ball or solder bump 70 may be disposed. As depicted, the nickel cap 88 and the underbump interface 89 present relatively little surface area or other resistance to shear forces 82 applied laterally to the solder bump 70.

Figure 6:
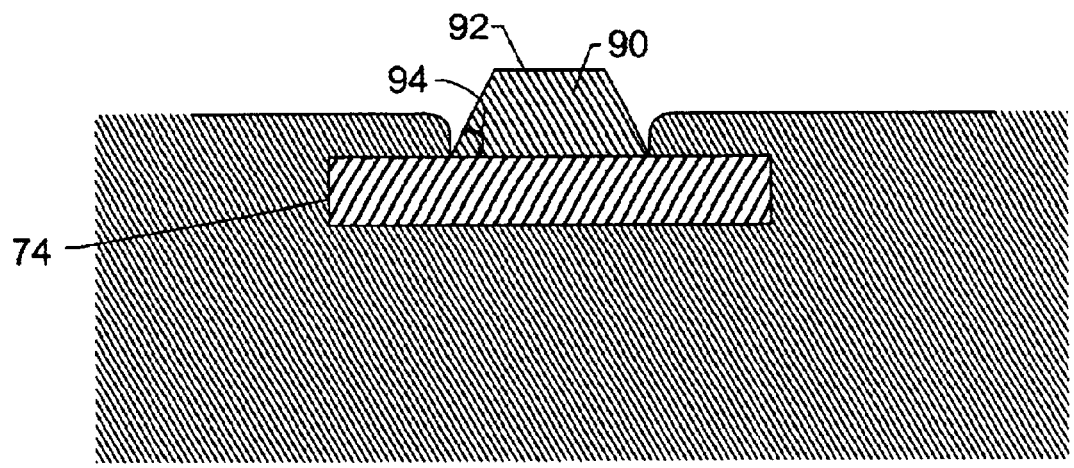
FIG. 6 illustrates a cross-sectional view of a conductive layer disposed upon a bond pad in accordance with the present invention.
Figure 6A:
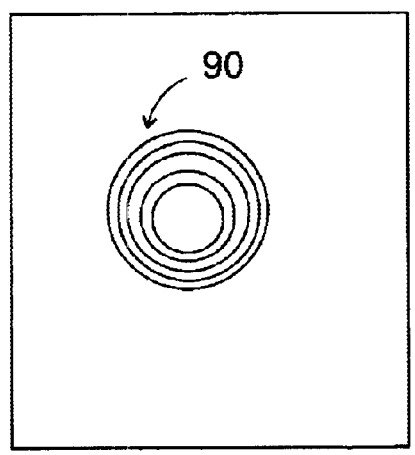
FIG. 6A illustrates an overhead view of the conductive layer of FIG. 6.
Figure 6B:
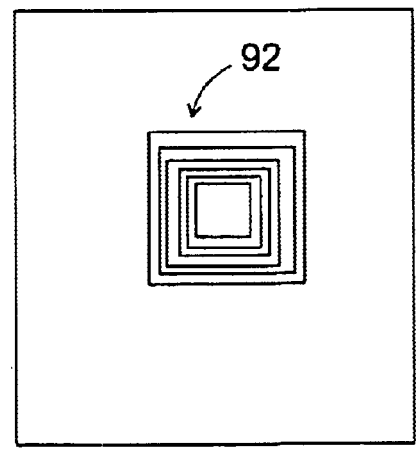
FIG. 6B illustrates an alternate overhead view of the conductive layer of FIG. 6.

FIG. 6, in accordance with an embodiment of the present invention, depicts an alternative nickel cap structure in the form of a tapered contact 90. In one embodiment, the tapered contact 90 is formed as a truncated substantially pyramidal structure, wherein the top of the structure is flattened and smaller relative to the base. The tapered contact 90, however, may also be formed with a pointed top simply by allowing the chemical deposition process, discussed below, to continue uninterrupted. It should also be understood that the tapered contact 90 may be somewhat tilted and/or have terraced sides. As seen from above in FIGS. 6A and 6B, the tapered contact 90 may be formed as a cone, FIG. 6A, or as a square-based pyramid, FIG. 6B, depending on the shape of the contact pad 74. Therefore, as used in the present application, the tapered contact 90 is to be understood to include any structure broader at its base than its apex and where the apex may be either a point or a flat surface. Indeed, the process described herein may even form structures which are substantially vertical, i.e. pillar or block like, as long as the top area of the structure is equal to or less than the base area of the structure.

In the embodiment depicted in FIG. 6, the tapered contact 90 is formed by an electroless nickel deposition process. The Everon™ SMT electroless nickel chemical bath, produced by Shipley Ronal™, has been found to produce satisfactory results, though similar baths may produce equivalent results. The electroless nickel deposition may be accomplished by exposing the contact pad to the bath at a temperature of under 100° C., and typically in the range of 85° C. to 97° C., such as 90° C., with agitation. Agitation may be produced by stir bars, laminar flow, turbulent flow, moving the substrate, etc.

As nickel deposition occurs, successive layers of nickel encompass less area than the preceding layers, ultimately forming the desired tapered contact 90. The height of the tapered contact 90 as well as the top formation, i.e., flat or pointed, may be regulated by controlling the deposition time, temperature, agitation level and/or amount or type of stabilizer used. For example, presumably longer exposure times will allow both higher and pointier tapered structures 90. The height and top of the tapered contact 90 affect the amount of underbump interface 92 presented by the surface area of the tapered contact 90.

The pitch 94 of the tapered sides may be regulated by controlling the flow of the chemical bath across the deposition zone, i.e. the contact pad 74, as well as the temperature of the bath, which controls the rate of chemical reaction and deposition. Reducing flow of the chemical bath across the deposition zone and maintaining a temperature of 95° to 97° C. may produce tapered contacts 90 which are pillar like, i.e. tapered structures where the pitch 94 is large. Conversely, higher flow rates and lower chemical bath temperatures, such as 85° to 90° C. may yield tapered structures 90 where the pitch 94 is smaller, i.e. more angular.

The addition of other chemicals to the chemical bath may also affect the deposition process, and thereby the shape of the tapered contacts 90. For example, the addition of a stabilizer such as thiourea to the chemical bath has been found to prevent formation of the tapered contact 90, instead producing the previously known mushroom shaped caps. Conversely, the addition of lead acetate stabilizer to the chemical bath produces tapered contacts 90 of greater pitch 94, i.e. more vertical.

Figure 7:
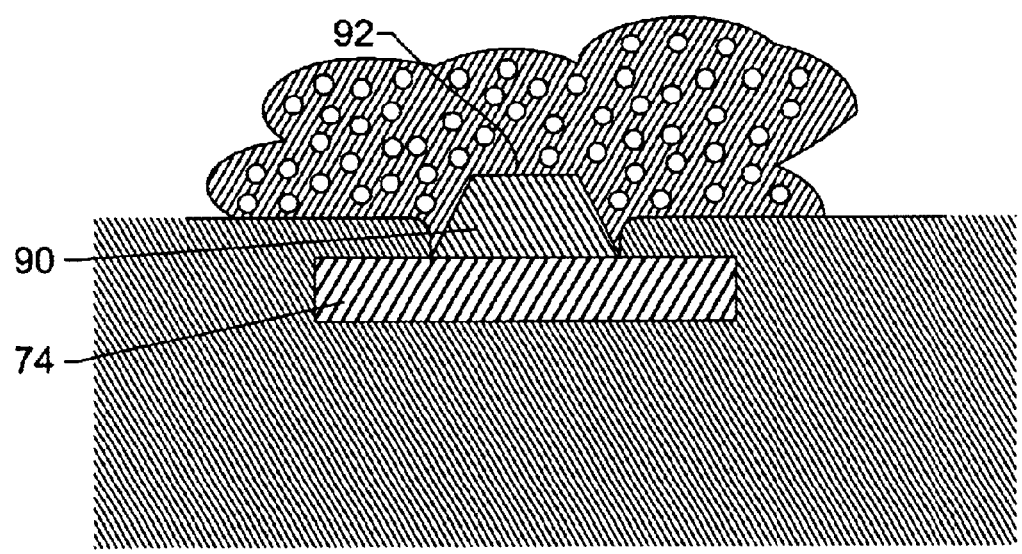
FIG. 7 illustrates a cross-sectional view of solder paste disposed upon a conductive layer in accordance with the present invention.
Figure 8:
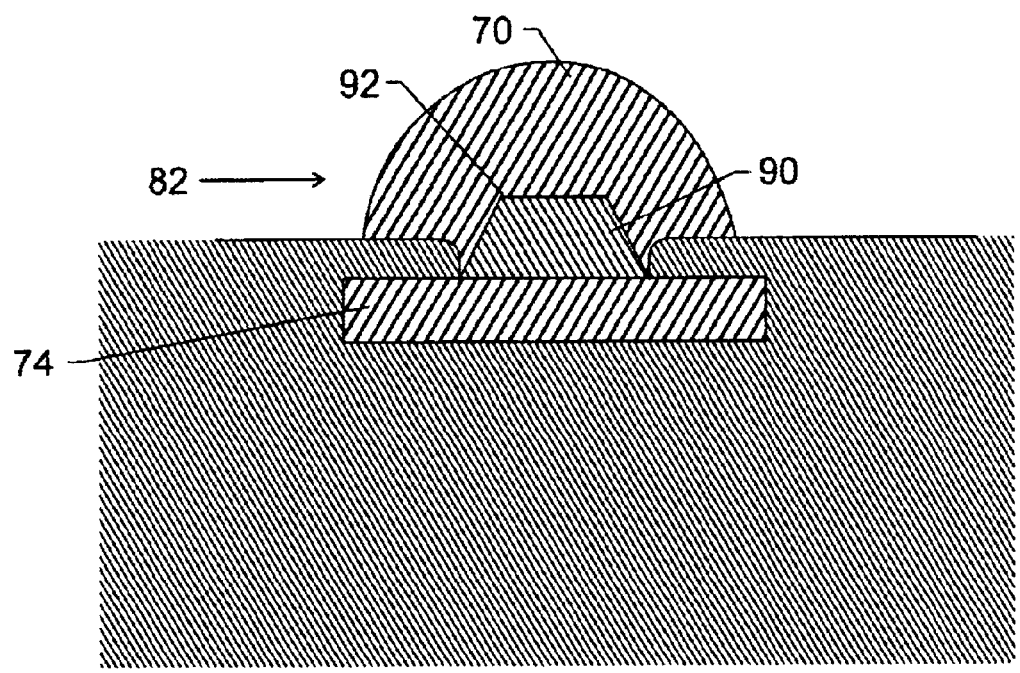
FIG. 8 illustrates a cross-sectional view of solder bump disposed upon a conductive layer in accordance with the present invention.

Referring now to FIGS. 7 and 8, the use of the tapered contacts 90 as an underbump metalization structure is depicted. In particular, after formation of the tapered contact 90, solder paste 96 may be applied to the tapered contact 90 by a variety of means known in the art. The solder paste 96 is typically composed of a flux 98 and solder particles 100. After thermal treatment, solder bumps 70 are formed on the tapered contacts 90, as depicted in FIG. 8. Due to the shape of the tapered contact 90 as well as the increased surface area presented by the underbump interface 92, shear forces 82 can be better resisted by the solder bump 70.

Figure 9:
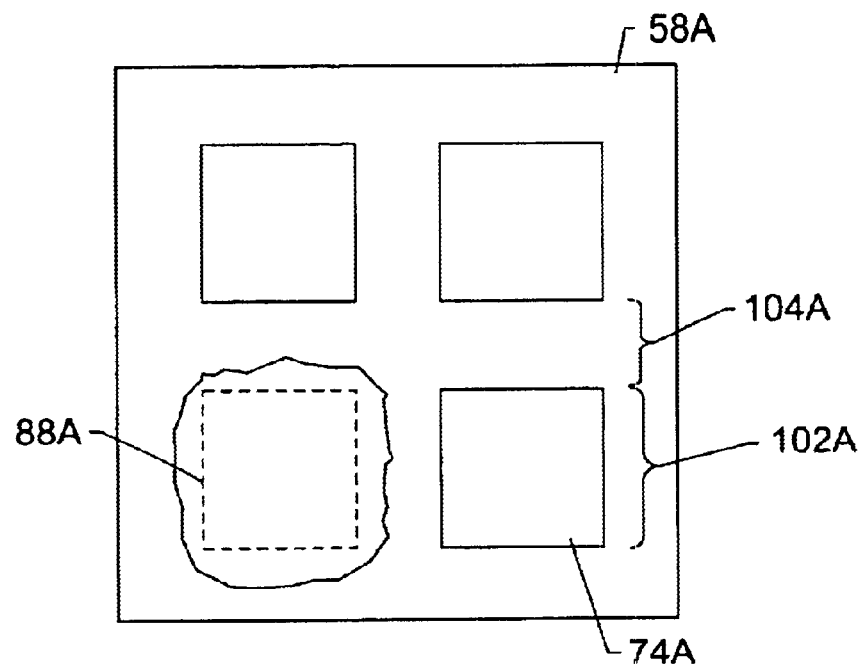
FIG. 9 illustrates a plan view of conventional bond pads disposed upon an I/C package.

Additionally, the formation of the tapered structures 90 allows for different configurations of contact pads 74 on a substrate 54 or a chip 40. Referring now to FIG. 9, a conventional placement of contact pads 74A upon a substrate 58A is depicted. As depicted, the contact pads 74A possess a length and width described by a contact pad dimension 102A. Clearly, if the contact pads 74A were circular the relevant dimension might be a radius or circumference and so on for other shapes. For purposes of the depicted embodiment, however, the contact pad dimension 102A describes, directly or indirectly, the surface dimensions of the contact pad 74A. Additionally, the contact pads 74 are separated by an inter-pad spacing 104. Using conventional techniques, the contact pad dimension 102, here the length and the width, would typically be about 100 microns with an inter-pad spacing 104 of about 55 microns. An inter-pad spacing 104 of about 55 microns is typical using conventional plating techniques due to the spillover produced by conventional plating techniques, as pads are too close may contact one another and, thus, produce an unwanted connection. A nickel cap 88A, representative of the prior techniques, is depicted on one of the contact pads 74A for reference.

Figure 10:
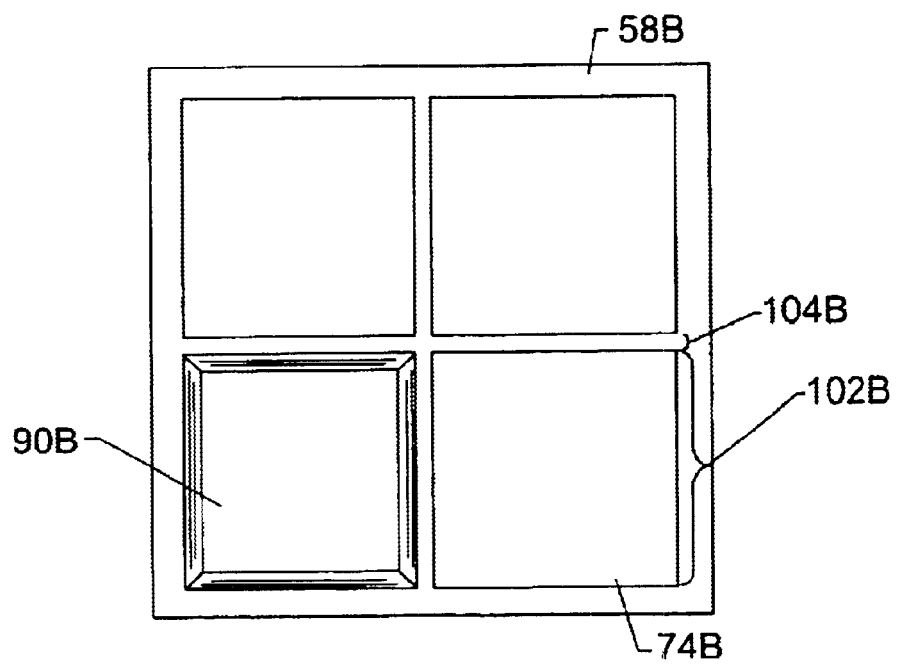
FIG. 10 illustrates a plan view of bond pads disposed upon an I/C package in accordance with one embodiment of the present invention.

Referring now to FIG. 10, using the present techniques, which eliminate the spillover associated with prior techniques, larger contact pads 74B may be utilized since the inter-pad spacing 104B may be drastically reduced due to the use of tapered contacts 90B. On a substrate 58B identical to that depicted in FIG. 9, the contact pads, possessing contact pad dimensions 102B of 150 microns and inter-pad spacing 104B of 10 microns, are depicted in FIG. 10. These larger contact pads 74B might be more useful in wire-bonding or ball grid array applications when combined with the present techniques for forming tapered contact structures 90B.

Figure 11:
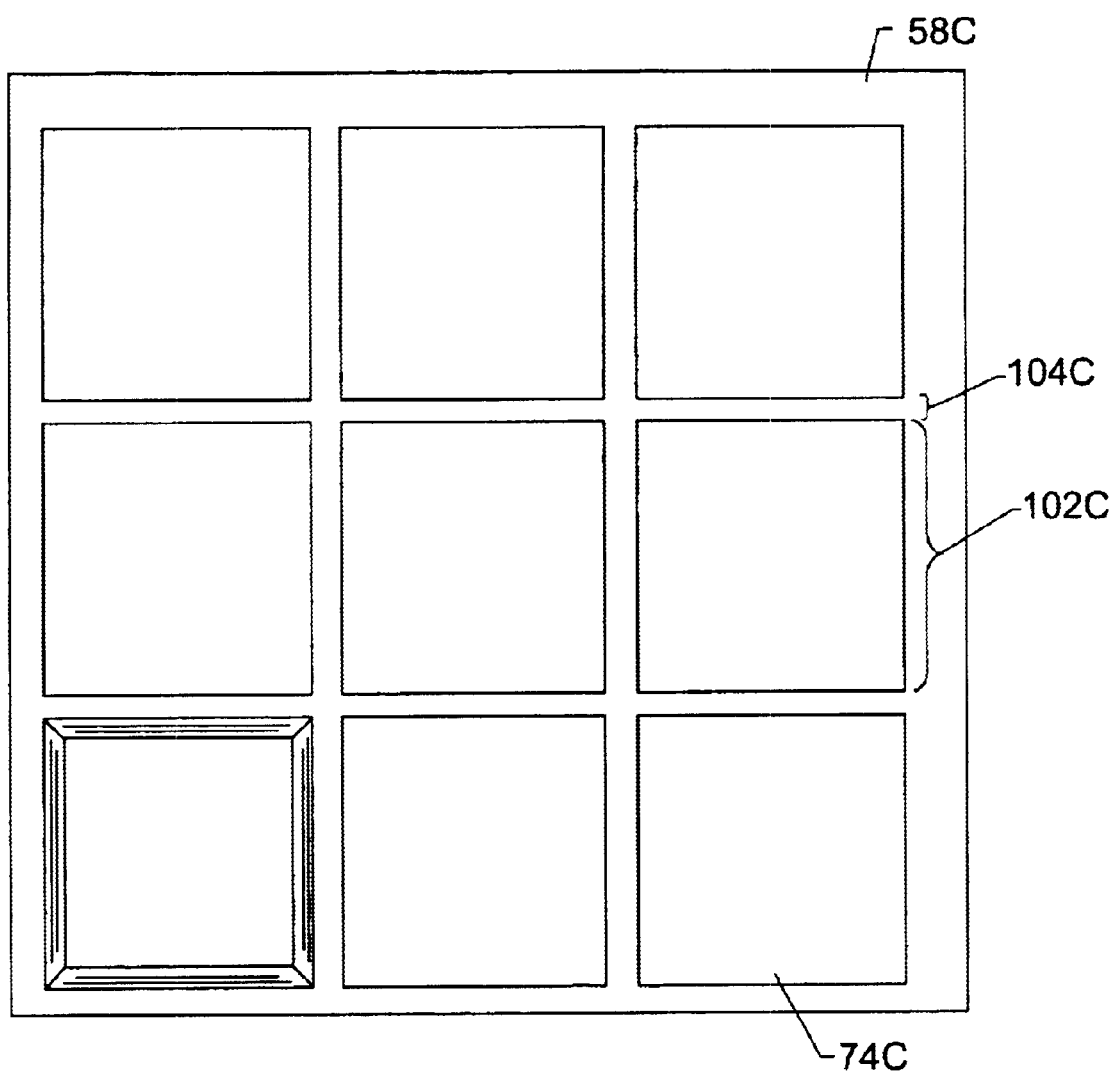
FIG. 11 illustrates a plan view of bond pads disposed upon an I/C package in accordance with a second embodiment of the present invention.

Similarly, FIG. 11 depicts how, using the present techniques, substantially more contact pads 74C may be placed on a substrate 58C. FIG. 11 depicts both a substrate 58C and contact pads 74C of equal dimension to those depicted in FIG. 9. As depicted, the contact pad dimensions 102C are once again 100 microns, however inter-pad spacing 104C is only 10 microns due to the use of tapered contacts 90C. Use of the tapered contacts 90C thereby allow a greater density of contact pads 74C to be achieved on the substrate 58C. This increase in density may allow scaling of the I/C package using conventional ball grid array or wire-bonding techniques.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of plating nickel comprising the acts of:
   providing a nickel bath;
   controlling the temperature of the nickel bath to no more than 90 degrees Celsius; and
   placing a substrate having a region to be plated in the nickel bath and causing movement of the nickel bath relative to the region to cause nickel from the nickel bath to plate onto the region to form a substantially tapered structure on the region.

2. The method of claim 1, wherein the tapered structure is a substantially pyramidal.

3. The method of claim 1, wherein the tapered structure is substantially conical.

4. The method of claim 1, wherein the temperature of the nickel bath is between 85 degrees Celsius and 90 degrees Celsius.

5. The method of claim 1, wherein the movement of the nickel bath is accomplished by agitation of the nickel bath.

6. The method of claim 1, wherein the movement of the nickel bath is accomplished by stirring the nickel bath.

7. The method of claim 1, wherein the movement of the nickel bath is a laminar flow.

8. The method of claim 1, wherein the movement of the nickel bath is a turbulent flow.

9. The method of claim 1, comprising adding a stabilizer to the nickel bath to regulate the pitch of the tapered structure.

10. The method of claim 9, wherein the stabilizer comprises lead acetate.

11. The method of claim 1, wherein the movement of the nickel bath is adjusted to regulate the pitch of the tapered structure.

12. The method of claim 1, wherein the temperature of the nickel bath is adjusted to regulate the pitch of the tapered structure.

13. A method of forming an electrical interconnection comprising the acts of:
  providing a nickel bath;
  controlling the temperature of the nickel bath to no more than 90 degrees Celsius;
  placing a substrate having a region to be plated in the nickel bath;
  causing movement of the nickel bath relative to the region to cause nickel from the nickel bath to plate onto the region to form a tapered structure; and
  forming a solder ball over the tapered structure.

14. The method of claim 13, wherein the temperature of the nickel bath is between 85 degrees Celsius and 90 degrees Celsius.

15. The method of claim 13, wherein the movement of the nickel bath is accomplished by agitation of the nickel bath.

16. The method of claim 13, wherein the movement of the nickel bath is accomplished by stirring the nickel bath.

17. The method of claim 13, wherein the movement of the nickel bath comprises a laminar flow of the nickel bath.

18. The method of claim 13, wherein the movement of the nickel bath comprises a turbulent flow of the nickel bath.

19. The method of claim 13, wherein the movement of the nickel bath comprises moving the substrate through the nickel bath.

20. The method of claim 13, comprising adding a stabilizer to the nickel bath to regulate the pitch of the tapered structures.

21. The method of claim 20, wherein the stabilizer comprises lead acetate.

22. The method of claim 13, wherein the movement of the nickel bath is adjusted to regulate the pitch of the tapered structures.

23. The method of claim 13, wherein the temperature of the nickel bath is adjusted to regulate the pitch of the tapered structures.

24. The method of claim 13, wherein the tapered structure is substantially pyramidal.

25. The method of claim 13, wherein the tapered structure is substantially conical.

* * * * *